(12) United States Patent
Park

(10) Patent No.: US 9,236,337 B2
(45) Date of Patent: Jan. 12, 2016

(54) SEMICONDUCTOR PACKAGE INCLUDING A SUBSTRATE HAVING A VENT HOLE

(71) Applicant: SAMSUNG ELECTRONICS CO., LTD., Suwon-si, Gyeonggi-do (KR)

(72) Inventor: Chan Park, Hwaseong-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 8 days.

(21) Appl. No.: 13/950,669

(22) Filed: Jul. 25, 2013

(65) Prior Publication Data

US 2014/0117543 A1  May 1, 2014

(30) Foreign Application Priority Data

Oct. 29, 2012  (KR) .................. 10-2012-0120537

(51) Int. Cl.
| | | |
|---|---|---|
| H01L 23/48 | (2006.01) | |
| H01L 23/52 | (2006.01) | |
| H01L 29/40 | (2006.01) | |
| H01L 23/02 | (2006.01) | |
| H01L 23/498 | (2006.01) | |
| H01L 23/13 | (2006.01) | |
| H01L 23/00 | (2006.01) | |
| H01L 23/31 | (2006.01) | |
| H01L 21/56 | (2006.01) | |

(52) U.S. Cl.
CPC .......... *H01L 23/49816* (2013.01); *H01L 23/13* (2013.01); *H01L 21/568* (2013.01); *H01L 23/3128* (2013.01); *H01L 23/49827* (2013.01); *H01L 24/13* (2013.01); *H01L 24/97* (2013.01); *H01L 2224/13111* (2013.01); *H01L 2224/13139* (2013.01); *H01L 2224/13144* (2013.01); *H01L 2224/13147* (2013.01); *H01L 2224/13155* (2013.01); *H01L 2224/16225* (2013.01); *H01L 2224/16227* (2013.01); *H01L 2224/81191* (2013.01); *H01L 2224/97* (2013.01); *H01L 2924/1306* (2013.01); *H01L 2924/15151* (2013.01); *H01L 2924/15311* (2013.01)

(58) Field of Classification Search
USPC ......... 257/738, 685, 686, 723, 777, 730, 731, 257/733, 773, 774, 782, 783, 786
See application file for complete search history.

(56) References Cited

U.S. PATENT DOCUMENTS

| | | | |
|---|---|---|---|
| 6,038,136 A | | 3/2000 | Weber |
| 6,297,543 B1 | | 10/2001 | Hong et al. |
| 7,307,347 B2 * | | 12/2007 | Yagi .............................. 257/773 |
| 7,568,922 B2 * | | 8/2009 | Yamashita et al. .............. 439/83 |

(Continued)

FOREIGN PATENT DOCUMENTS

| | | |
|---|---|---|
| JP | 2006-165324 | 6/2006 |
| KR | 1020010002847 | 1/2001 |

(Continued)

*Primary Examiner* — A. Sefer
*Assistant Examiner* — Dilinh Nguyen
(74) *Attorney, Agent, or Firm* — F. Chau & Associates, LLC

(57) ABSTRACT

A semiconductor package includes a substrate having a vent hole extending through the substrate, a semiconductor chip mounted on an upper surface of the substrate, a plurality of solder ball pads formed on a lower surface of the substrate, and an encapsulant covering the upper surface of the substrate, the semiconductor chip, and an entirety of the lower surface of the substrate except for regions in which the solder ball pads are formed.

9 Claims, 13 Drawing Sheets

(56) References Cited

U.S. PATENT DOCUMENTS

| | | |
|---|---|---|
| 2011/0309481 A1 | 12/2011 | Huang et al. |
| 2011/0309523 A1 | 12/2011 | Takahashi |
| 2011/0312133 A1 | 12/2011 | Park et al. |
| 2011/0317383 A1 | 12/2011 | Guzek |
| 2012/0032314 A1 | 2/2012 | Chen et al. |
| 2012/0032322 A1 | 2/2012 | Lin et al. |
| 2012/0038063 A1 | 2/2012 | Meyer et al. |
| 2012/0056314 A1 | 3/2012 | Pagaila et al. |
| 2012/0056334 A1 | 3/2012 | Yang et al. |
| 2012/0061824 A1 | 3/2012 | Pagaila et al. |
| 2012/0061858 A1 | 3/2012 | Park et al. |
| 2012/0068353 A1 | 3/2012 | Huang et al. |
| 2012/0070939 A1 | 3/2012 | Dunne et al. |
| 2012/0074587 A1 | 3/2012 | Koo et al. |
| 2012/0088330 A1 | 4/2012 | Chua et al. |
| 2012/0089180 A1 | 4/2012 | Fathi et al. |
| 2012/0094436 A1 | 4/2012 | Liu et al. |
| 2012/0098123 A1 | 4/2012 | Yu et al. |
| 2012/0126402 A1 | 5/2012 | Hatakeyama et al. |
| 2012/0126418 A1 | 5/2012 | Feng et al. |

FOREIGN PATENT DOCUMENTS

| | | |
|---|---|---|
| KR | 1020010004527 | 1/2001 |
| KR | 1020020059175 | 7/2002 |
| KR | 1020020061292 | 7/2002 |
| KR | 1020110092045 | 8/2011 |

\* cited by examiner

SEMICONDUCTOR PACKAGE INCLUDING A SUBSTRATE HAVING A VENT HOLE

CROSS-REFERENCE TO RELATED APPLICATIONS

This application claims priority under 35 U.S.C. §119 to Korean Patent Application No. 10-2012-0120537, filed on Oct. 29, 2012, the disclosure of which is incorporated by reference herein in its entirety.

TECHNICAL FIELD

Exemplary embodiments of the present inventive concept relate to a semiconductor package and a method of fabricating the same.

DISCUSSION OF THE RELATED ART

In a semiconductor package structure, electrical connections between a semiconductor chip and a substrate may be implemented using wire bonding. However, when wire bonding is utilized, wires may be disconnected in the subsequent molding process. Further, due to the length and configuration of the wires, there may be a limit to the degree that the thickness of the package may be reduced.

As a result, flip chip bonding technology may be used instead of wire bonding to electrically connect the semiconductor chip and the substrate. Utilization of flip chip bonding may reduce electrical signal transfer paths and improve reliability of the semiconductor package.

SUMMARY

According to exemplary embodiments of the present inventive concept, a semiconductor package has a structure that allows for the removal of a void(s) near a lower portion of a semiconductor chip in the semiconductor package.

According to exemplary embodiments of the present inventive concept, a method of fabricating a semiconductor package allows for the fabrication of a semiconductor package having a structure that allows for the removal of a void(s) near a lower portion of a semiconductor chip in the semiconductor package.

According to an exemplary embodiment of the present inventive concept, a semiconductor package includes a substrate including a vent hole extending through the substrate, a semiconductor chip mounted on an upper surface of the substrate, a plurality of solder ball pads formed on a lower surface of the substrate, and an encapsulant covering the upper surface of the substrate, the semiconductor chip, and an entirety of the lower surface of the substrate except for regions in which the solder ball pads are formed.

According to an exemplary embodiment of the present inventive concept, a method of fabricating a semiconductor package includes mounting a semiconductor chip on an upper surface of a substrate, wherein the substrate includes a vent hole extending through the substrate, forming a plurality of solder ball pads on a lower surface of the substrate, and forming an encapsulant, wherein the encapsulant covers the upper surface of the substrate, the semiconductor chip, and an entirety of the lower surface of the substrate except for regions in which the solder ball pads are formed.

According to an exemplary embodiment of the present inventive concept, a semiconductor package includes a substrate including a vent hole fully extending through the substrate, a semiconductor chip mounted on an upper surface of the substrate, wherein the upper surface includes a first connection region and a first non-connection region forming an entirety of the upper surface, a plurality of connection pads formed on the upper surface of the substrate, a plurality of bumps formed on a lower surface of the semiconductor chip, wherein the plurality of bumps and the plurality of connection pads are electrically connected to each other at the first connection region, a plurality of solder ball pads formed in a second connection region of a lower surface of the substrate, wherein the lower surface opposes the upper surface, and the lower surface comprises the second connection region and a second non-connection region forming an entirety of the lower surface, and an encapsulant covering an entirety of the first and second non-connection regions and the semiconductor chip.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION OF THE EXEMPLARY EMBODIMENTS

Figure 1:
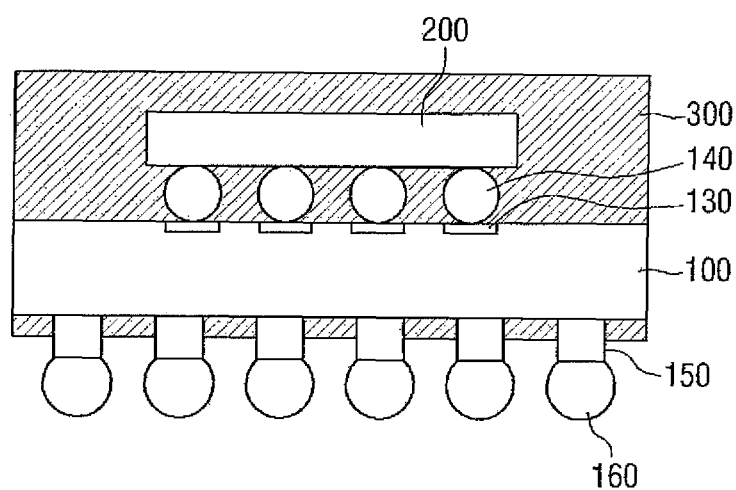
FIG. 1 is a cross-sectional view of a semiconductor package, according to an exemplary embodiment of the present inventive concept.

Exemplary embodiments of the present inventive concept will be described more fully hereinafter with reference to the accompanying drawings. Like reference numerals may refer to like elements throughout the accompanying drawings.

It is understood that when a layer is referred to as being "on" another layer or substrate, it can be directly on the other layer or substrate, or intervening layers may also be present.

Spatially relative terms, such as "beneath," "below," "lower," "above," "upper" and the like, may be used herein for ease of description to describe one element or feature's relationship to another element(s) or feature(s) as illustrated in the figures. It is understood that the spatially relative terms are intended to encompass different orientations of the device in use or operation in addition to the orientation depicted in the figures.

According to exemplary embodiments of the present inventive concept, a semiconductor package and a method of fabricating the same as described hereinafter relate to a semiconductor package having a structure in which a void near a lower portion of a semiconductor chip may be removed. In order to remove the void near the lower portion of the semiconductor chip, a vent hole may exist on a substrate. In a molded underfill (MUF) process, an encapsulant may flow to a lower surface of the substrate through the vent hole on the substrate after covering an upper surface of the substrate and the semiconductor chip. Solder ball pads may be formed in regions of the lower surface of the substrate other than those in which the encapsulant flows.

Further, in order to reduce the thickness of the semiconductor package, the thickness of molding may be reduced. In an exemplary embodiment, the solder ball pads may be formed on the entire lower surface of the substrate other than areas in which the encapsulant is formed, and the encapsulant may be formed on the entire lower surface of the substrate other than areas in which the solder ball pads are formed.

Figure 2:
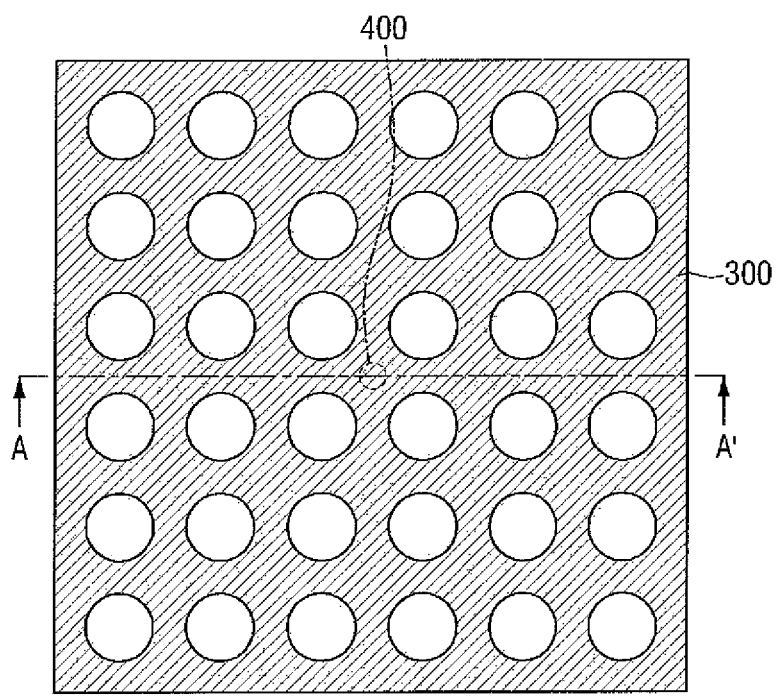
FIG. 2 is a bottom view of a semiconductor package, according to an exemplary embodiment of the present inventive concept.
Figure 3:
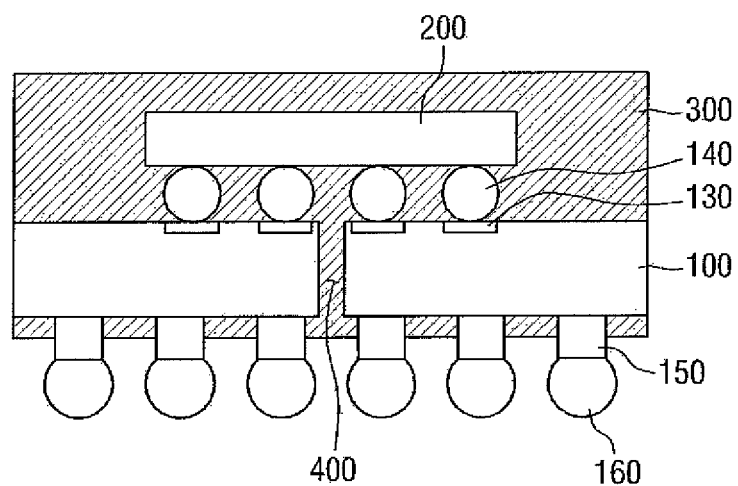
FIG. 3 is a cross-sectional view taken along line A-A' in FIG. 2, according to an exemplary embodiment of the present inventive concept.

FIG. 1 is a cross-sectional view of a semiconductor package, according to an exemplary embodiment of the present inventive concept. FIG. 2 is a bottom view of a semiconductor package, according to an exemplary embodiment of the present inventive concept. FIG. 3 is a cross-sectional view taken along line A-A' in FIG. 2.

Referring to FIGS. 1 to 3, a semiconductor package may include a substrate 100, a vent hole 400, a semiconductor chip 200, solder ball pads 150, and an encapsulant 300.

The substrate 100 may be any type of substrate used for semiconductor packaging including, for example, a printed circuit board (PCB) or a ceramic substrate. The substrate 100 has an upper surface and a lower surface, which are located on opposing sides of the substrate 100. Connection pads 130 may be formed on the upper surface of the substrate 100. The semiconductor chip 200 may be formed on the upper surface of the substrate 100, and the solder ball pads 150 may be formed on the lower surface of the substrate 100. The vent hole 400 may be formed on the substrate 100. The vent hole 400 may serve as a path through which the encapsulant 300 passes, as described in further detail below. The vent hole 400 may full extend through the substrate 100.

The vent hole 400 is formed on the substrate 100 and extends through a portion of the substrate 100, as shown in FIG. 3. The vent hole 400 is formed such that a liquid material (e.g., encapsulant 300) can flow from an area near the upper surface of the substrate 100 to an area near the lower surface of the substrate 100. The vent hole 400 may be formed below the semiconductor chip 200 that is mounted on the upper surface of the substrate 100, however, the location at which the vent hole 400 is formed is not limited thereto. For example, the vent hole may be formed in an area adjacent to the semiconductor chip 200. When the encapsulant 300 is injected during a molding process, a void (e.g., a bubble) may occur. When a void occurs, the vent hole 400 may serve as a path through which the encapsulant 300 passes to remove the void that may be trapped near the lower portion of the semiconductor chip 200. Removing the void that is trapped near the lower portion of the semiconductor chip 200 may improve the reliability of the semiconductor package.

The semiconductor chip 200 is mounted on the upper surface of the substrate 100. The semiconductor chip 200 may be mounted at or near the center region of the upper surface of the substrate 100 using an adhesive means such as, for example, liquid epoxy, adhesive tape, or a conductive medium, however the mounting location and the mounting means of the semiconductor chip 200 are not limited thereto. Bumps 140 may be formed on the upper surface of the semiconductor chip 200. For example, the bumps 140 of the semiconductor chip 200 may be formed in areas corresponding to the connection pads 130 of the substrate 100. That is, the semiconductor chip 200 on which the bumps 140 are formed may be mounted on the upper surface of the substrate 100, and may be electrically connected to the substrate 100 through the bumps 140. The bumps 140 may be formed of, for example, gold, silver, nickel, copper, tin, or an alloy thereof, however the bumps 140 are not limited thereto. For example, the bumps 140 may be formed of copper-nickel-lead (Cu—Ni—Pb), copper-nickel-gold (Cu—Ni—Au), copper-nickel (Cu—Ni), Nickel-gold (Ni—Au), or nickel-silver (Ni—Ag).

Although FIGS. 1 to 3 show one semiconductor chip 200 included in the semiconductor package, exemplary embodiments of the present inventive concept are not limited thereto. For example, the semiconductor package may include one or more additional semiconductor chips, which may be, for example, vertically laminated to the semiconductor chip 200.

The solder ball pads 150 may be formed on the lower surface of the substrate 100. The solder ball pads 150 may project further from the lower surface of the substrate 100 than the encapsulant 300 that covers the lower surface of the substrate 100, as shown in FIGS. 1 and 3. That is, the height of the formed solder ball pads 150 may be greater than the height of the formed encapsulant 300 that covers the lower surface of the substrate 100. When the encapsulant 300 flows to the lower surface of the substrate 100, the solder ball pads 150 may not be covered by the encapsulant 300. As a result, the entirety of the lower surface of the substrate 100, except for the regions in which the solder ball pads 150 are formed on the lower surface of the substrate 100, may be covered by the encapsulant 300.

The upper surface of the substrate 100 may be described as having a connection region and a non-connection region. The connection region refers to all areas of the upper surface of the substrate 100 that contact the bumps 140, and the non-connection region refers to all other areas of the upper surface of the substrate 100 (e.g., all areas that do not contact the bumps 140). Together, the connection region and the non-connection region form the entirety of the upper surface of the substrate 100. Similarly, the lower surface of the substrate 100 may be described as having a connection region that refers to all areas of the lower surface of the substrate 100 that contact the solder ball pads 150, and a non-connection region that refers to all other areas of the lower surface of the substrate 100 (e.g., all areas that do not contact the solder ball pads 150). Together, the connection region and the non-connection region form the entirety of the lower surface of the substrate 100.

When the solder ball pads 150 project further than the encapsulant 300 that covers the lower surface of the substrate 100, the solder ball pads 150 may be formed along a large portion of the lower surface of the substrate 100 (e.g., the solder ball pads 150 may be formed in every region of the lower surface of the substrate 100 that is not covered by the encapsulant 300). For example, the solder ball pads 150 may be formed along the lower surface of the substrate 100 at intervals (e.g., regular intervals) such that large spaces between certain solder ball pads 150 on the lower surface of the substrate 100 may not be present. As a result, a large portion of the lower surface of the substrate 100 may be utilized for the formation of the solder ball pads 150, and limitations relating to the solder ball layout (e.g., a reduced number of total solder ball pads 150) may be avoided.

To prevent oxidation, an organic solder paste (OSP) may be formed on the solder ball pads 150. Further, connection terminals 160 may be formed on the solder ball pads 150. The connection terminals 160 may electrically connect the semiconductor package to a module board, a main circuit board, etc. The connection terminals 160 may be, for example, solder balls or conductive bumps, however, the connection terminals 160 are not limited thereto.

The encapsulant 300 is formed such that it covers the entire non-connection region of the upper surface of the substrate 100, the semiconductor chip 200, and the entire non-connection region of the lower surface of the substrate 100. The encapsulant 300 is formed such that it fills a space between the semiconductor chip 200 and the substrate 100 therewith and protects the bumps 400, and may increase an adhesive force between the semiconductor chip 200 and the substrate 100. Further, the encapsulant 300 may maintain the external appearance of the semiconductor package and may protect the semiconductor chip 200 from external physical impact or moisture. Since the encapsulant 300 is formed such that it covers the entire non-connection region of the lower surface of the substrate 100 (e.g., all areas other than those in which the solder ball pads 150 are formed), the encapsulant 300 may be molded on both surfaces of the substrate 100 (e.g., the encapsulate 300 may eliminate empty spaces on both surfaces of the substrate 100). As a result, the degree of warping of the substrate 100 may be reduced. As the thickness of the semiconductor package is reduced, the molding thickness may be decreased. According to exemplary embodiments, since the encapsulant 300 is molded on both surfaces of the substrate 100, as opposed to being molded only on the upper surface of the substrate 100 (which may result in warping of the substrate 100 due to the difference in coefficient of thermal expansion between the substrate 100 and the encapsulant 300), the degree of warping of the substrate 100 may be reduced.

According to exemplary embodiments, the encapsulant 300 may be formed such that a surface height of the encapsulant 300 is greater than or equal to the upper surface of the semiconductor chip 200, however the surface height of the encapsulant 300 is not limited thereto. For example, although FIGS. 1 and 3 illustrate the encapsulant 300 formed with a surface height that is greater than the upper surface of the semiconductor chip 200, exemplary embodiments are not limited thereto. The encapsulant 300 may be formed during a molding process using, for example, Epoxy Molding Compound (EMC), silicon resin, polyimide, etc.

Figure 4:
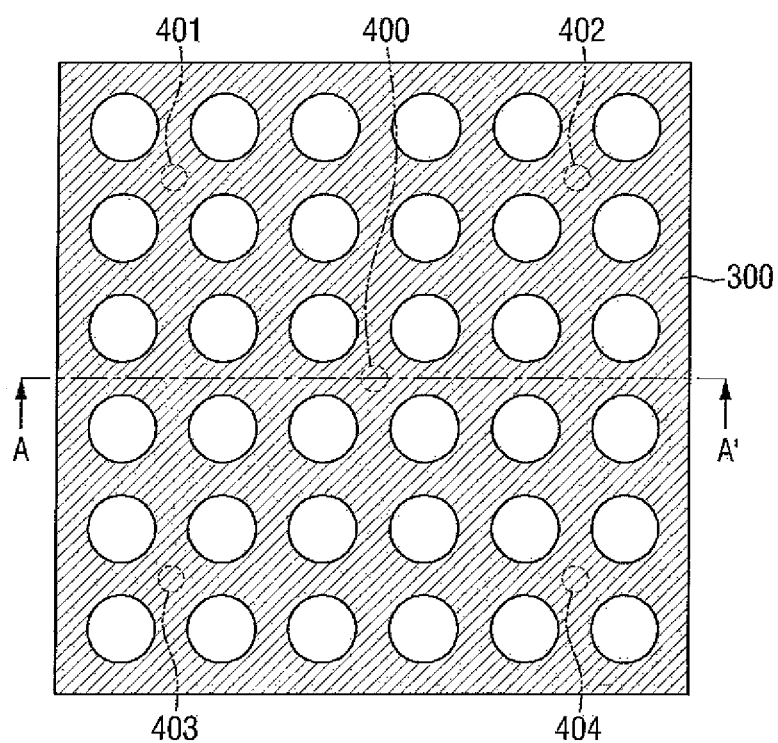
FIG. 4 is a bottom view of a semiconductor package, according to an exemplary embodiment of the present inventive concept.

FIG. 4 is a bottom view of a semiconductor package, according to an exemplary embodiment of the present inventive concept. A description of elements previously described may be omitted.

Referring to FIG. 4, in a semiconductor package according to an exemplary embodiment of the present inventive concept, the substrate 100 may include a plurality of vent holes 400 to 404. The number of vent holes 400 to 404 is not limited to the five vent holes shown in FIG. 4. For example, exemplary embodiments having a plurality of vent holes may include two to four vent holes or more than five vent holes. The plurality of vent holes 400 to 404 may be formed on the substrate 100 such that a liquid material (e.g., encapsulant 300) may flow from an area near the upper surface of the substrate 100 to an area near the lower surface of the substrate 100. The plurality of vent holes 400 to 404 may be formed below the semiconductor chip 200 that is mounted on the upper surface of the substrate 100, however the locations at which the vent holes 400 to 404 are formed are not limited thereto. For example, some or all of the vent holes 400 to 404 may be formed in areas adjacent to the semiconductor chip 200. When the encapsulant 300 is injected during the molding process, a void (e.g., a bubble) may occur. When a void occurs, the vent holes 400 to 404 may serve as a path through which the encapsulant 300 passes to remove the void that may be trapped near the lower portion of the semiconductor chip 200. Formation of the plurality of vent holes 400 may increase the flow speed of the encapsulant 300, and may improve the removal efficiency of the void.

Figure 5:
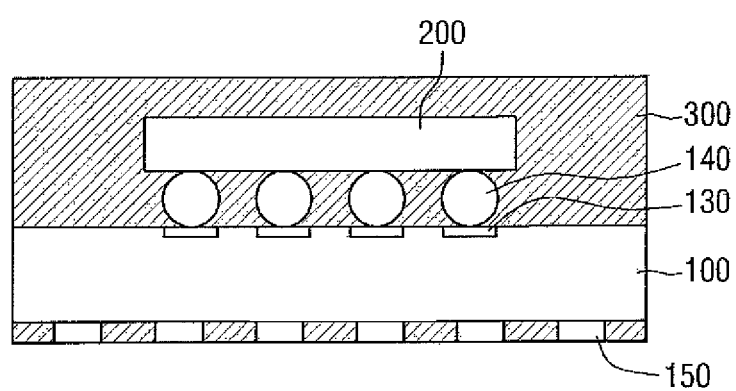
FIG. 5 is a cross-sectional view of a semiconductor package, according to an exemplary embodiment of the present inventive concept.

FIG. 5 is a cross-sectional view of a semiconductor package, according to an exemplary embodiment of the present inventive concept. A description of elements previously described may be omitted.

Referring to FIG. 5, in a semiconductor package according to an exemplary embodiment of the present inventive concept, the solder ball pads 150 may be formed such that they are exposed from the encapsulant 300 that covers the lower surface of the substrate 100. That is, the height of the formed solder ball pads 150 may be equal to, or about equal to the height of the formed encapsulant 300 that covers the lower surface of the substrate 100, and the encapsulant does not cover the lower surface of the solder ball pads 150. Forming the solder ball pads 150 such that their height is equal to, or about equal to the height of the formed encapsulant 300 that covers the lower surface of the substrate (as opposed to forming the solder ball pads 150 such that their height is greater than the height of the formed encapsulant 300) may reduce the thickness of the semiconductor package. When the encapsulant 300 flows to the lower surface of the substrate 100, the entire lower surface of the substrate, except for the regions where the solder ball pads 150 are formed on the lower surface of the substrate 100, may be covered by the encapsulant 300.

The upper surface of the substrate 100 may be described as having a connection region and a non-connection region. The connection region refers to all areas of the upper surface of the substrate 100 that contact the bumps 140, and the non-connection region refers to all other areas of the upper surface of the substrate 100 (e.g., all areas that do not contact the bumps 140). Together, the connection region and the non-connection region form the entirety of the upper surface of the substrate 100. Similarly, the lower surface of the substrate 100 may be described as having a connection region that refers to all areas of the lower surface of the substrate 100 that contact the solder ball pads 150, and a non-connection region that refers to all other areas of the lower surface of the substrate 100 (e.g., all areas that do not contact the solder ball pads 150). Together, the connection region and the non-connection region form the entirety of the lower surface of the substrate 100.

When the solder ball pads 150 are formed such that they are exposed from the encapsulant 300 that covers the lower surface of the substrate 100, the solder ball pads 150 may be formed on a large portion of the lower surface of the substrate 100 (e.g., the solder ball pads 150 may be formed in every region of the lower surface of the substrate 100 that is not covered by the encapsulant 300). For example, the solder ball pads 150 may be formed along the lower surface of the substrate 100 at intervals (e.g., regular intervals) such that large spaces between certain solder ball pads 150 on the lower surface of the substrate 100 may not be present. As a result, a large portion of the lower surface of the substrate 100 may be utilized for the formation of the solder ball pads 150, and limitations relating to the solder ball layout (e.g., a reduced number of total solder ball pads 150) can be avoided. An organic solder paste (OSP) may be formed on the solder ball pads 150 to prevent oxidation.

Figure 6:
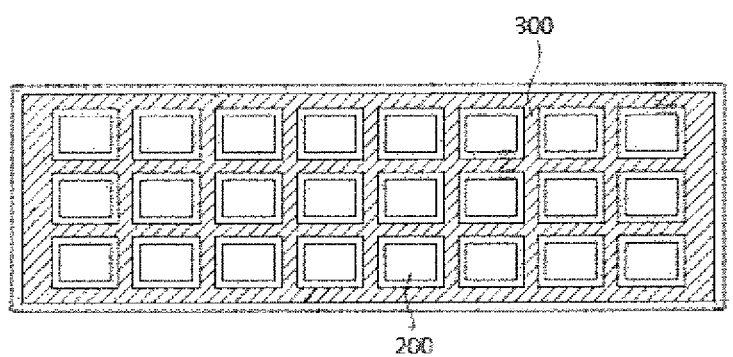
FIG. 6 is a perspective view of a semiconductor package, according to an exemplary embodiment of the present inventive concept.

FIG. 6 is a perspective view of a semiconductor package, according to an exemplary embodiment of the present inventive concept. A description of elements previously described may be omitted.

Referring to FIG. 6, in a semiconductor package according to an exemplary embodiment of the present inventive concept, a plurality of semiconductor chips 200 may be mounted on the upper surface of the substrate 100. The plurality of semiconductor chips 200 may be mounted on the upper surface of the substrate 100 using a predetermined adhesive means such as, for example, liquid epoxy, adhesive tape, or a conductive medium, however the mounting location and the mounting means are not limited thereto. Bumps 140 may be formed on the lower surfaces of the plurality of semiconductor chips 200. For example, the bumps 140 on the plurality of semiconductor chips 200 may be formed in areas corresponding to the connection pads 130 of the substrate 100. That is, the plurality of semiconductor chips 200 on which the bumps 140 are formed may be mounted on the upper surface of the substrate 100, and may be electrically connected to the substrate 100 through the bumps 140. The bumps may be formed of, for example, gold, silver, nickel, copper, tin, or an alloy thereof, however the bumps 140 are not limited thereto. For example, the bumps 140 may be formed of copper-nickel-lead (Cu—Ni—Pb), copper-nickel-gold (Cu—Ni—Au), copper-nickel (Cu—Ni), Nickel-gold (Ni—Au), or nickel-silver (Ni—Ag).

Hereinafter, a method of fabricating a semiconductor package according to an exemplary embodiment of the present inventive concept will be described with reference to FIGS. 7 to 11.

Figure 7:
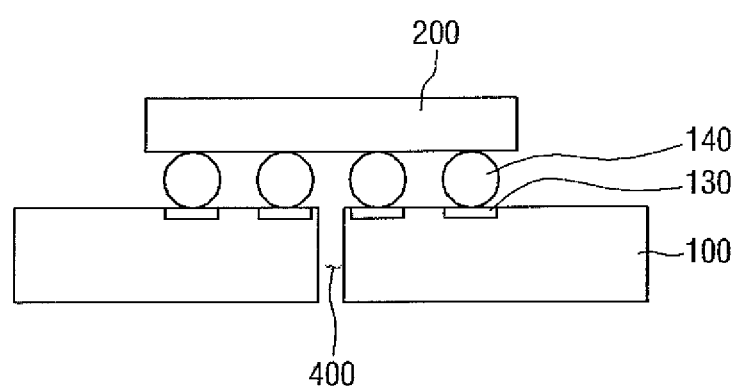
FIGS. 7 to 11 are views illustrating a method of fabricating a semiconductor package, according to an exemplary embodiment of the present inventive concept.

Referring to FIG. 7, a semiconductor chip 200 is mounted on an upper surface of a substrate 100 on which a vent hole 400 is formed. Connection pads 130 may be formed on the upper surface of the substrate 100, and bumps 140 may be formed on the lower surface of the semiconductor chip 200. The semiconductor chip 200 may be mounted such that the bumps 140 and the connection pads 130 are electrically connected to each other.

Figure 8:
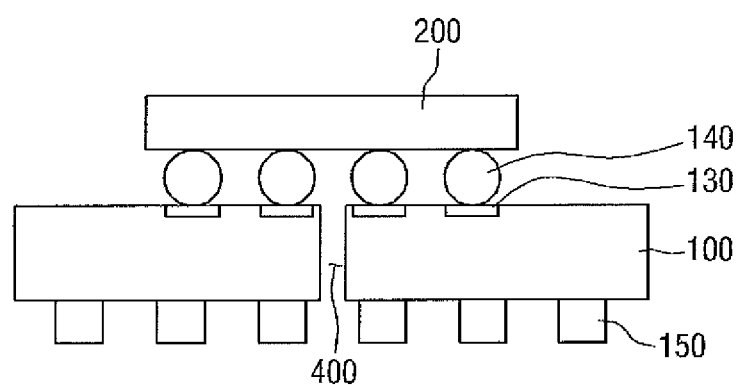

Referring to FIG. 8, solder ball pads 150 are formed on the lower surface of the substrate 100. The solder ball pads 150 may be formed such that they project further from the lower surface of the substrate 100 than an encapsulant 300 that covers the lower surface of the substrate 100, as described below.

Figure 9:
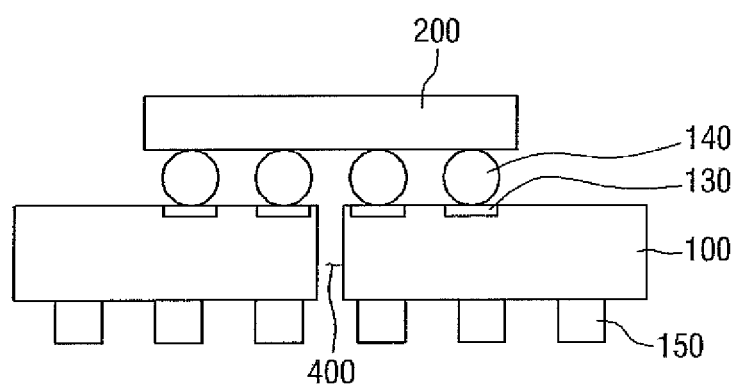

Referring to FIG. 9, a release film 500 is formed on the solder ball pads 150. The release film 500 may be formed to have a structure such that the solder ball pads 150 project further from the lower surface of the substrate 100 than the encapsulant 300 that covers the lower surface of the substrate 100. As a result of the presence of the release film 500, the encapsulant 300 may not cover the solder ball pads 150 when the encapsulant 300 is injected, as described below.

Figure 10:
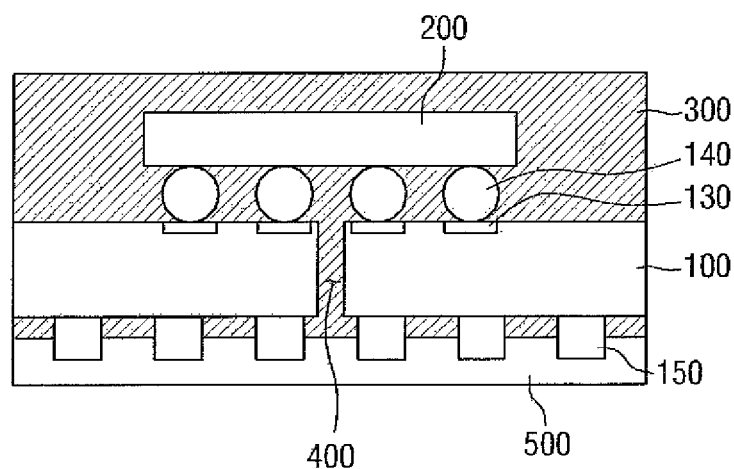

Referring to FIG. 10, the encapsulant 300 is injected such that it covers the entire non-connection region of the upper surface of the substrate 100 (e.g., all areas other than those that contact the bumps 140), the semiconductor chip 200, and the entire non-connection region of the lower surface of the substrate 100 (e.g., all areas other than those in which the solder ball pads 150 are formed). The encapsulant 300 covers the upper surface of the substrate 100 and the semiconductor chip 200, and flows to the lower surface of the substrate 100 through the vent hole 400. After the encapsulant 300 is injected, the encapsulant 300 is hardened.

Figure 11:
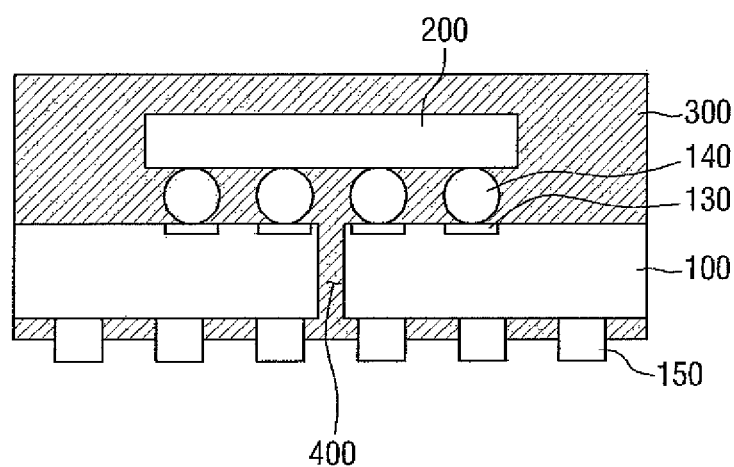

Referring to FIG. 11, the release film 500 is removed. After removing the release film 500, the solder ball pads 150 have a structure in which the solder ball pads 150 project further from the lower surface of the substrate 100 than the encapsulant 300 that covers the lower surface of the substrate 100.

Figure 12:
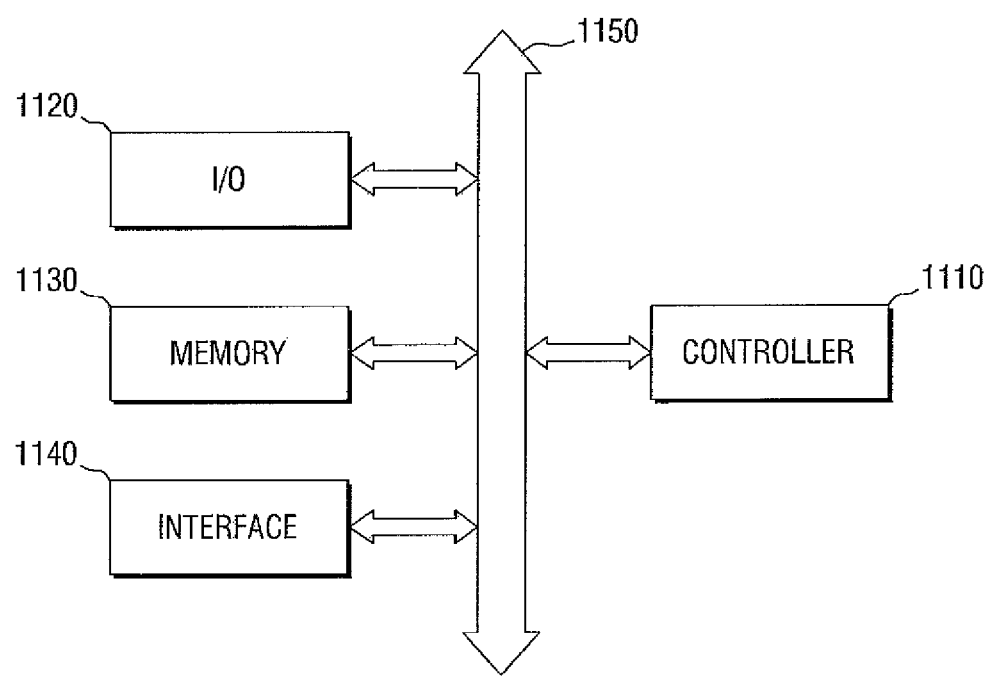
FIG. 12 is a block diagram of an electronic system including a semiconductor device according to exemplary embodiments of the present inventive concept.

FIG. 12 is a block diagram of an electronic system including the semiconductor device according to exemplary embodiments of the present inventive concept.

Referring to FIG. 12, an electronic system 1100 according to an exemplary embodiment of the present inventive concept may include a controller 1110, an input/output (I/O) device 1120, a memory device 1130, an interface 1140, and a bus 1150. The controller 1110, the I/O device 1120, the memory device 1130, and/or the interface 1140 may be coupled to one another through the bus 1150. The bus 1150 corresponds to paths through which data is transferred.

The controller 1110 may include at least one of, for example, a microprocessor, a digital signal processor, a microcontroller, or logic elements that can perform similar functions. The I/O device 1120 may include, for example, a keypad, a keyboard, or a display device. The memory device 1130 may store data and/or commands. The interface 1140 may transfer the data to a communication network, or receive the data from the communication network. The interface 1140 may be wired or wireless. For example, the interface 1140 may include an antenna or a wired/wireless transceiver. The electronic system 1100 may further include a high-speed DRAM and/or SRAM as an operating memory, which may improve the operation of the controller 1110. Thin film transistors according to some exemplary embodiments of the present inventive concept may be provided inside the memory device 1130, or may be provided as a part of the controller 1110 and the I/O device 1120.

The electronic system 1100 may be, for example, a PDA (Personal Digital Assistant), a portable computer, a web tablet, a wireless phone, a mobile phone, a digital music player, a memory card, or any other type of electronic device that can transmit and/or receive information.

Figure 13:
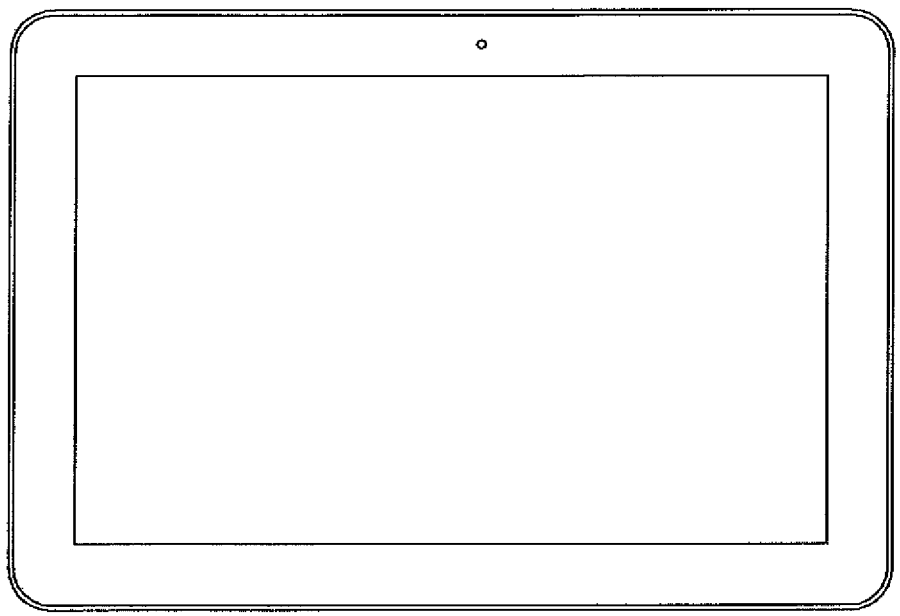
FIGS. 13 and 14 are exemplary views of a semiconductor system in which the semiconductor device according to exemplary embodiments of the present inventive concept can be applied.
Figure 14:
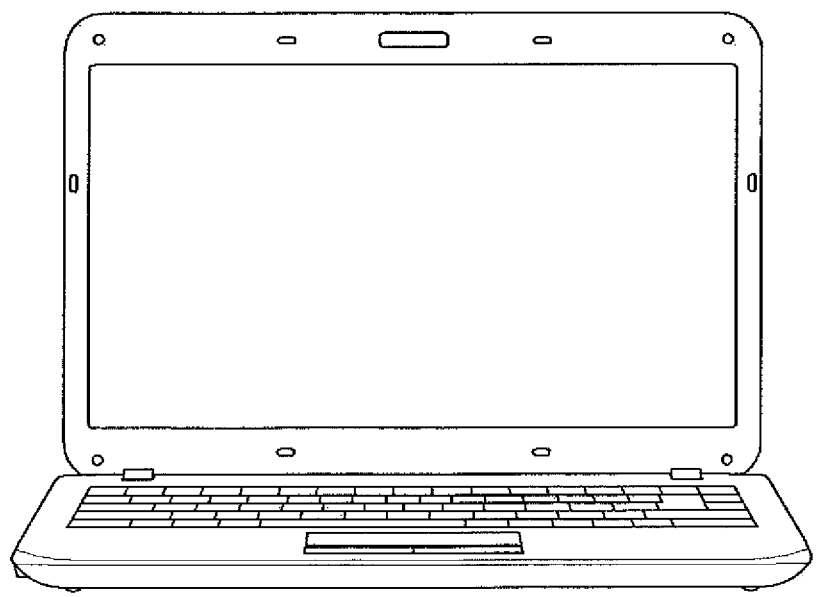

FIGS. 13 and 14 are exemplary views of a semiconductor system in which the semiconductor device according to exemplary embodiments of the present inventive concept can be applied. FIG. 13 illustrates a tablet PC, and FIG. 14 illustrates a notebook PC. At least one of the semiconductor devices according to exemplary embodiments of the present inventive concept can be applied to the tablet PC or the notebook PC. In addition, semiconductor devices according to exemplary embodiments of the present inventive concept may be applied to other integrated circuit devices.

While the present inventive concept has been particularly shown and described with reference to the exemplary embodiments thereof, it will be understood by those skilled in the art that various changes in form and detail may be made therein without departing from the spirit and scope of the present inventive concept as defined by the following claims.

What is claimed is:

1. A semiconductor package, comprising:
a substrate comprising a vent hole extending through the substrate;
a semiconductor chip mounted on an upper surface of the substrate;
a plurality of solder ball pads formed on a lower surface of the substrate, wherein the lower surface opposes the upper surface; and
an encapsulant covering the upper surface of the substrate, the semiconductor chip, and an entirety of the lower surface of the substrate except for regions in which the solder ball pads are formed,
wherein the solder ball pads project further from the lower surface of the substrate than the encapsulant that covers the lower surface of the substrate, and the encapsulant covering the upper surface of the substrate includes a same material as the encapsulant covering the lower surface of the substrate.

2. The semiconductor package of claim 1, wherein the vent hole is one of a plurality of vent holes, and the substrate comprises the plurality of vent holes extending through the substrate.

3. The semiconductor package of claim 1, wherein the vent hole is disposed below the semiconductor chip.

4. The semiconductor package of claim 1, further comprising:
 a plurality of connection pads formed on the upper surface of the substrate; and
 a plurality of bumps formed on a lower surface of the semiconductor chip,
 wherein the plurality of bumps and the plurality of connection pads are electrically connected to each other.

5. The semiconductor package of claim 1, wherein the encapsulant comprises Epoxy Molding Compound (EMC).

6. The semiconductor package of claim 1, wherein the semiconductor chip is one of a plurality of semiconductor chips, and the plurality of semiconductor chips are mounted on the upper surface of the substrate.

7. A semiconductor package, comprising:
 a substrate comprising a vent hole fully extending through the substrate;
 a semiconductor chip mounted on an upper surface of the substrate, wherein the upper surface comprises a first connection region and a first non-connection region forming an entirety of the upper surface;
 a plurality of connection pads formed on the upper surface of the substrate;
 a plurality of bumps formed on a lower surface of the semiconductor chip, wherein the plurality of bumps and the plurality of connection pads are electrically connected to each other at the first connection region;
 a plurality of solder ball pads formed in a second connection region of a lower surface of the substrate, wherein the lower surface opposes the upper surface, and the lower surface comprises the second connection region and a second non-connection region forming an entirety of the lower surface; and
 an encapsulant covering an entirety of the first and second non-connection regions and the semiconductor chip,
 wherein the solder ball pads project further from the lower surface of the substrate than the encapsulant that covers the lower surface of the substrate, and the encapsulant covering the upper surface of the substrate includes a same material as the encapsulant covering the lower surface of the substrate.

8. The semiconductor package of claim 7, wherein the vent hole is one of a plurality of vent holes, and the substrate comprises the plurality of vent holes fully extending through the substrate.

9. The semiconductor package of claim 7, wherein the vent hole is disposed below the semiconductor chip.

* * * * *